US007521338B2

(12) United States Patent
Ancheta, Jr. et al.

(10) Patent No.: US 7,521,338 B2
(45) Date of Patent: Apr. 21, 2009

(54) METHOD FOR SAWING SEMICONDUCTOR WAFER

(75) Inventors: Patricio Vergara Ancheta, Jr., Baguio (PH); Heintje Sardonas Vilaga, La Trinidad (PH); Ella Chan Sarmiento, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 210 days.

(21) Appl. No.: 11/615,260

(22) Filed: Dec. 22, 2006

(65) Prior Publication Data

US 2008/0153260 A1 Jun. 26, 2008

(51) Int. Cl.
*H01L 21/46* (2006.01)

(52) U.S. Cl. ....................... 438/464; 438/460; 438/462; 438/68; 438/13

(58) Field of Classification Search .................. 438/68, 438/13, 460–646; 257/E21.599
See application file for complete search history.

(56) References Cited

U.S. PATENT DOCUMENTS

| | | | | |
|---|---|---|---|---|
| 5,461,008 | A * | 10/1995 | Sutherland et al. | 83/15 |
| 6,105,567 | A * | 8/2000 | Sun et al. | 125/13.01 |
| 2003/0203538 | A1 | 10/2003 | Peng et al. | |
| 2005/0090076 | A1 | 4/2005 | Barsky et al. | |

* cited by examiner

*Primary Examiner*—Dung A. Le
(74) *Attorney, Agent, or Firm*—Yingsheng Tung; Wade J. Brady, III; Frederick J. Telecky, Jr.

(57) ABSTRACT

Semiconductor wafer sawing systems and methods are described in which a wafer may be secured in a sawing position having a surface exposed to incur sawing with at least a portion of the exposed wafer surface positioned below the center of gravity of the wafer such that prevailing force of gravity may be used to assist in the removal of contaminants from the wafer.

7 Claims, 3 Drawing Sheets

METHOD FOR SAWING SEMICONDUCTOR WAFER

TECHNICAL FIELD

The invention relates to electronic semiconductor devices and manufacturing. More particularly, the invention relates to systems and methods for sawing semiconductor wafers in order to singulate prepared microelectronic devices therefrom.

BACKGROUND OF THE INVENTION

Wafer dicing is the process of cutting a semiconductor wafer to separate individual microelectronic chips, or dice, assembled on the wafer. The wafer is ordinarily placed and secured horizontally atop a cutting table. A wafer frame is used to support the wafer, which is usually placed on a tape, one side of which has a sticky surface that holds the wafer during sawing. Saw equipment including a spindle assembly for manipulating a rotating circular blade is positioned atop the secured wafer. The wafer is sawn into individual chips by cutting through saw streets pre-defined on the wafer for that purpose. In conventional wafer dicing, silicon dust contamination is prevalent. This is because silicon dust particulates generated by the action of the saw slicing through the silicon wafer settle on the remaining wafer surface during further cutting.

A conceptual side view representative of wafer sawing systems and methods known in the art is shown in FIG. 1 (prior art). A saw table 10 or platform supports the wafer 12, which is held in place by an arrangement typically including a wafer frame 14 and a holding mechanism such as tape 16 designed for that particular purpose. A spindle assembly 18 is positioned above the secured wafer 12 and is used to bring a rotating saw blade 20 into contact with the wafer 12 for cutting. An optical device such as a camera 22 is used to align and control the path of the saw blade 20. Thus, wafer sawing systems familiar in the arts place a wafer atop a horizontal table such that the exposed surface of the wafer is face up, that is, directly opposed to the force of gravity. In this position, contaminant particles such as sawdust generated during sawing tend to remain on the wafer surface. Nozzles 24 positioned near the wafer 12 are typically used to cool the surfaces during sawing and for dispensing solvent 26 such as high pressure water or soapy water to wash away sawdust particles generated by the cutting process.

In order to overcome the contamination of sawdust settling on the wafer surface during sawing, it is known in the arts to wash the wafer during sawing. One approach is to use a high pressure wash of purified water to rinse the wafer surface. The use of a high pressure wash carries with it the significant risk of damaging the wafer surface and/or Protective Overcoat (PO) layer. Another common approach is to spray the wafer surface using surfactants or soap additives mixed with water or another suitable solvent. The use of surfactants introduces additional costs in terms of materials, labor, and equipment. It also carries the risk of replacing one form of contamination with another, by potentially leaving behind soap residue on the wafer surface.

Due to the technical challenges and problems with the present state of the art, improved systems and methods for sawing semiconductor wafers with reduced surface contamination from sawdust and improved wafer surface cleaning would be useful and advantageous in the arts. The present invention is directed to overcoming, or at least reducing the effects of, one or more of the problems described above.

SUMMARY OF THE INVENTION

In carrying out the principles of the present invention, in accordance with preferred embodiments thereof, systems and methods for sawing semiconductor wafers enlist acceleration provided by the force of gravity to assist in the removal of contaminants. According to a preferred embodiment, a method for sawing a semiconductor wafer includes the step of providing a cutting table configured for securing a wafer in a sawing position. The sawing position orients a secured wafer with a surface exposed to incur sawing. At least a portion of the exposed wafer surface is positioned below the center of gravity of the wafer, thus the prevailing force of gravity may be used to facilitate the departure of contaminants from the wafer. In a further step, a rapidly spinning saw blade is used to cut a wafer secured in the sawing position. In another step, a fluid is used for washing a wafer secured in the sawing position.

According to one aspect of the invention, a step of configuring a saw table for securing a wafer in a sawing position is designed to orient the exposed surface of a wafer secured therein in approximate alignment toward the prevailing force of gravity.

According to another aspect of the invention, a step of configuring a saw table for securing a wafer in a sawing position includes orienting the sawing position such that the exposed surface of a wafer secured therein is approximately perpendicular to the prevailing force of gravity.

According to yet another aspect of the invention, in a preferred embodiment of a system for sawing a semiconductor wafer, a cutting table is provided for securing a wafer in a sawing position oriented to use the prevailing force of gravity to facilitate the departure of contaminants from the wafer. The sawing position is adapted to expose a surface of a secured wafer to incur sawing. The system also includes a spindle assembly and saw blade for sawing a wafer secured in the sawing position. One or more one nozzle is provided for dispensing fluid for washing a wafer secured in the sawing position during sawing.

According to still another aspect of the invention, the system includes a cutting table having a sawing position oriented such that the exposed surface of a wafer secured therein is in approximate alignment toward the prevailing force of gravity.

According to another aspect of the invention, the system includes a cutting table having a sawing position oriented such that the exposed surface of a wafer secured therein is approximately perpendicular to the prevailing force of gravity.

According to another aspect of the invention, the system includes one or more nozzle adapted to the dispensing of liquid for washing the wafer during sawing.

According to another aspect of the invention, the system includes one or more nozzle adapted to the dispensing of gas for washing the wafer during sawing.

The invention offers one or more advantages including but not necessarily limited to providing methods and systems for reducing the contact and/or adherence of saw-generated contaminants with a wafer surface during sawing, simplifying wafer surface cleaning, reducing the risk of damaging the wafer surface during cleaning, and reducing costs. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

Figure 1:
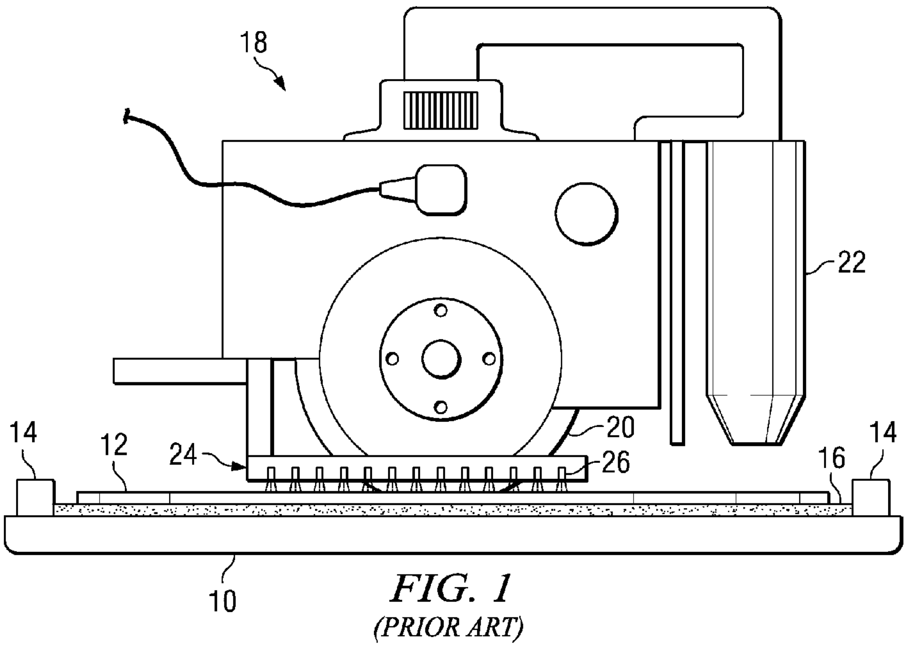
FIG. 1 (PRIOR ART)
FIG. 1 (prior art) is a conceptual side view representative of semiconductor wafer sawing methods and systems known in the art.

References in the detailed description correspond to like references in the various Figures unless otherwise noted. Descriptive and directional terms used in the written description such as first, second, top, bottom, upper, side, etc., refer to the drawings themselves as laid out on the paper and not to physical limitations of the invention unless specifically noted. For the sake of orienting the drawings, description, and claims herein, it is specified that the prevailing force of gravity acts from the bottom edge of the page as shown in the drawings. The drawings are not to scale, and some features of embodiments shown and discussed are simplified or amplified for illustrating the principles, features, and advantages of the invention.

DETAILED DESCRIPTION OF PREFERRED EMBODIMENTS

In general, the invention provides improved wafer sawing systems and methods adapting sawing and washing techniques to make use of acceleration provided by the prevailing force of gravity to assist in propelling contaminants away from the wafer.

The invention makes advantageous use of the force of gravity in semiconductor wafer sawing systems. In accordance with the principles and practice of the invention, the wafer to be sawn is positioned such that the prevailing force of gravity is used to facilitate the departure of contaminants from the wafer. Using the acceleration of gravity, sawdust particulates fall away from the wafer during sawing, either solely due to prevailing gravitational forces or further assisted by washing fluid. The sawdust particulates, and possibly other contaminants, along with washing fluid are then removed by a drain also assisted by gravity. In preferred embodiments using an inverted wafer position, that is, a position in which the planar surface of the wafer is aligned toward the prevailing force of gravity, e.g. downward, sawdust particulates generated by wafer sawing fall away from the wafer. In alternative embodiments employing the principles of the invention, the wafer to be sawn need not necessarily be completely inverted. For example, the wafer may alternatively be positioned such that its exposed surface is perpendicular to the prevailing force of gravity, e.g. sideways, without departure from the principles of the invention. Lesser angles may also be used, such as an inclined or declined plane, as long as some portion of the wafer surface is positioned below the wafer's center of gravity during sawing, such that with the aid of gravity the sawdust particulates tend to slide, roll, or bounce, and ultimately fall away from the wafer. Of course, it should be apparent that inverting the wafer provides the most dramatic application of the acceleration of gravity, reducing the reliance on the use of washing fluid, and that inclining the wafer at lesser angles provides less dramatic improvements over the traditional non-inverted horizontal position opposed to the force of gravity.

Figure 2:
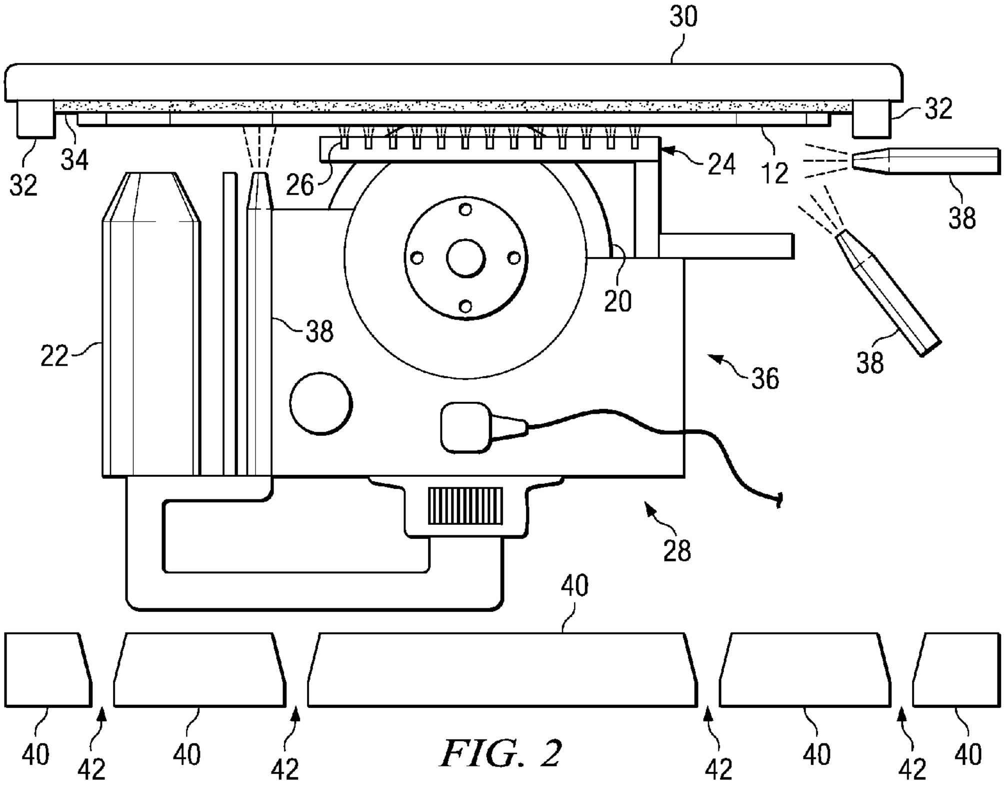
FIG. 2 is a conceptual side view of an example of preferred embodiments of systems and methods for wafer sawing according to the invention.

Referring to FIG. 2, a system 28 for sawing semiconductor wafers 12 (not part of the invention) has a cutting table 30 for securing a wafer 12 in a position to be sawn. A surface of the wafer 12 is exposed to receive the saw blade 20 and the wafer 12 is preferably secured using a wafer frame 32 and tape 34. For the sake of orienting the drawing and description of this example, it is specified that the prevailing force of gravity acts from the bottom edge of the page as shown in the drawing. It should be appreciated by those skilled in the arts that the orientation of the sawing position of the wafer 12 is such that gravity will have a tendency to induce contaminants to fall way from the exposed surface of the wafer 12 and from any saw cuts made therein. A spindle assembly 36 adapted for cutting in the selected position is used to bring a rapidly rotating saw blade 20 into contact with the secured wafer 12 for sawing, preferably using a suitable form of optical guidance 22. A nozzle assembly 24 for dispensing cooling and/or washing fluid during sawing may also be used to provide additional cleaning. Preferably, one or more additional nozzles 38 are provided for dispensing fluid such as water or compressed gas for washing the exposed surface of the wafer 12 during sawing. Preferably, a pan 40 may be used with drainage or vacuum apertures 42 for collecting washing fluid and contaminants removed during the sawing operation. Liquid solvents, preferably water, may be used to wash the wafer. High pressure gas such as Compressed Dry Air (CDA) or nitrogen may also, or alternatively, be used to waft sawdust particulates away from the wafer.

Figure 3:
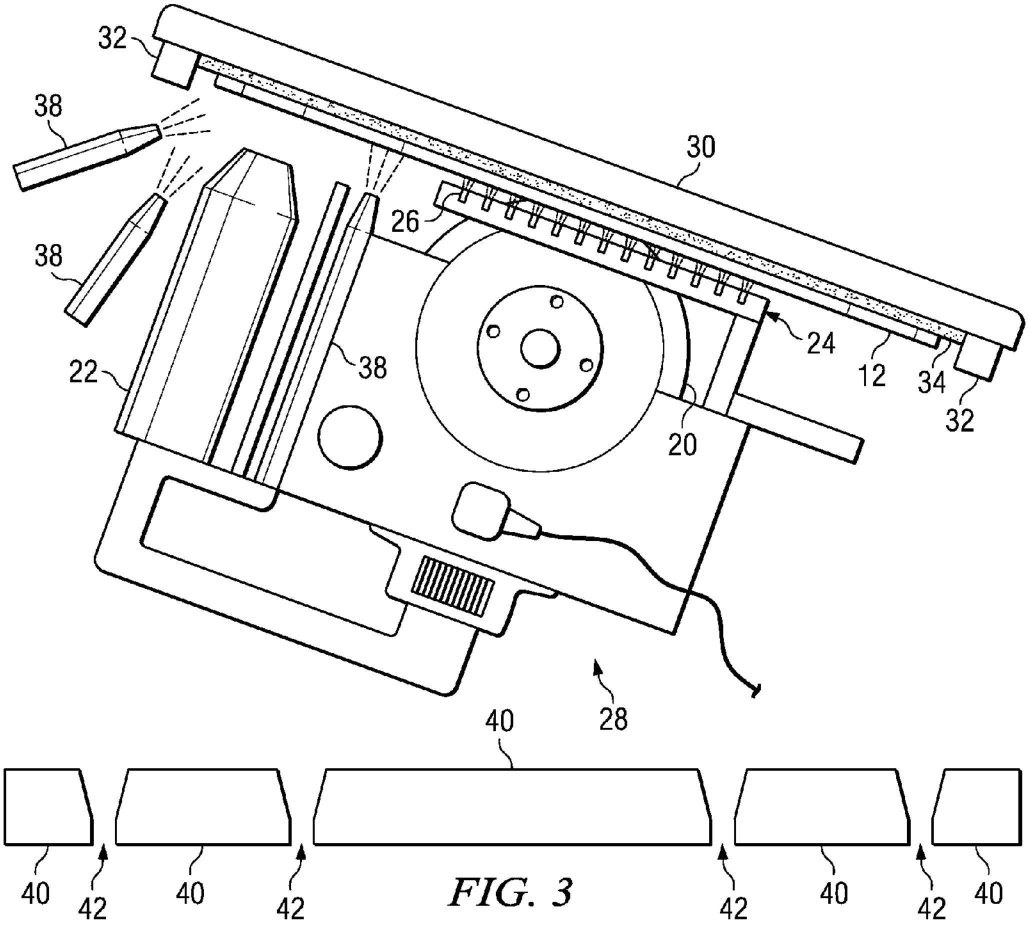
FIG. 3 is a conceptual side view of another example of preferred embodiments of systems and methods for wafer sawing according to the invention.
Figure 4:
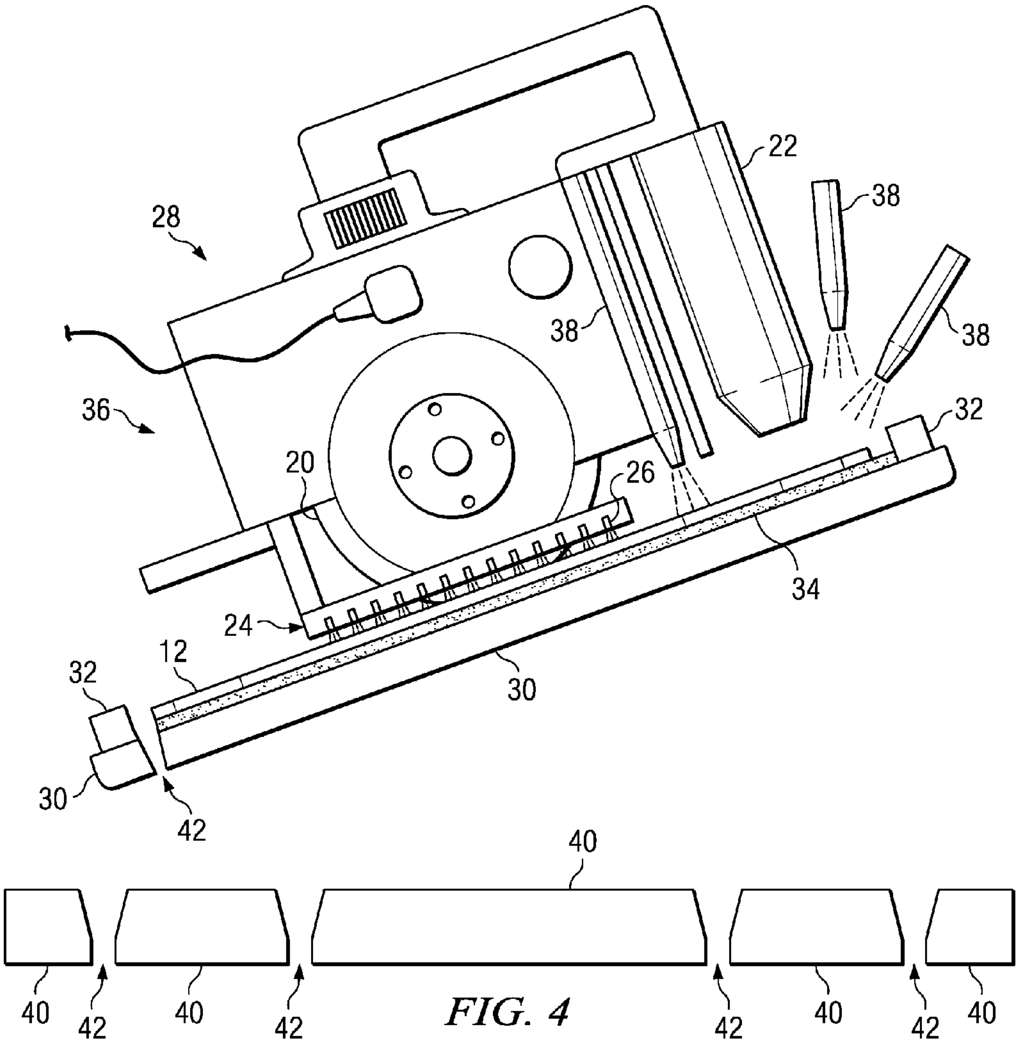
FIG. 4 is a conceptual side view of yet another example of preferred embodiments of systems and methods for wafer sawing according to the invention.

Examples of additional alternative embodiments of the invention are shown in FIG. 3 and FIG. 4. In a conceptual side view, FIG. 3 illustrates the practice of the invention using a cutting table 30 providing a sawing position at a decline, i.e., an inverted incline, with respect to the prevailing force of gravity. In FIG. 4, the cutting table 30 is configured to orient a wafer secured in the sawing position at an incline with respect to the prevailing force of gravity. In other respects, the embodiments of the invention shown in FIGS. 3 and 4 are similar to those described elsewhere herein.

As shown and described herein, preferred embodiments of the invention provide improved semiconductor wafer sawing systems and methods. The invention provides advantages potentially including but not limited to a reduction of sawdust contamination, reduction of the risk of damage to the wafer surface, increased efficiency, and reduced costs. While the invention has been described with reference to certain illustrative embodiments, the methods and systems described are not intended to be construed in a limiting sense. Various modifications and combinations of the illustrative embodiments as well as other advantages and embodiments of the invention will be apparent to persons skilled in the art upon reference to the description and claims.

We claim:

1. A method for sawing a semiconductor wafer comprising the steps of:

providing a cutting table configured for securing a wafer in a sawing position, whereby a secured wafer has a surface exposed to incur sawing and at least a portion of the exposed wafer surface is positioned below the center of gravity of the wafer such that prevailing force of gravity is used to facilitate the departure of contaminants from the wafer;

applying a rapidly spinning saw blade to a wafer secured in the sawing position, thereby sawing the wafer; and applying fluid for washing the wafer secured in the sawing position during sawing.

2. A method according to claim 1 wherein the step of configuring the saw table for securing a wafer in a sawing position further comprises orienting the sawing position such that the exposed surface of a wafer secured therein is in approximate alignment toward the prevailing force of gravity.

3. A method according to claim 1 wherein the step of configuring the saw table for securing a wafer in a sawing position further comprises orienting the sawing position such that the exposed surface of a wafer secured therein is approximately perpendicular to the prevailing force of gravity.

4. A method according to claim 1 wherein the step of configuring the saw table for securing a wafer in a sawing position further comprises orienting the sawing position such that the exposed surface of a wafer secured therein is inclined with respect to the prevailing force of gravity.

5. A method according to claim 1 wherein the step of configuring the saw table for securing a wafer in a sawing position further comprises orienting the sawing position such that the exposed surface of a wafer secured therein is declined with respect to the prevailing force of gravity.

6. A method according to claim 1 wherein the step of applying fluid for washing the wafer further comprises dispensing liquid.

7. A method according to claim 1 wherein the step of applying fluid for washing the wafer further comprises dispensing gas.

* * * * *